US009416451B2

(12) United States Patent
Je et al.

(10) Patent No.: US 9,416,451 B2
(45) Date of Patent: *Aug. 16, 2016

(54) SUBSTRATE PROCESSING DEVICE EQUIPPED WITH SEMICIRCLE SHAPED ANTENNA

(75) Inventors: Sung Tae Je, Gyeonggi-do (KR); Il Kwang Yang, Gyeonggi-do (KR); Byung Gyu Song, Gyeonggi-do (KR); Song Hwan Park, Chungcheongnam-do (KR)

(73) Assignee: Eugene Technology Co., Ltd., Yongin-si, Gyeonggi-do (KR)

( * ) Notice: Subject to any disclaimer, the term of this patent is extended or adjusted under 35 U.S.C. 154(b) by 568 days.

This patent is subject to a terminal disclaimer.

(21) Appl. No.: 13/822,434

(22) PCT Filed: Oct. 6, 2011

(86) PCT No.: PCT/KR2011/007399
§ 371 (c)(1),
(2), (4) Date: Mar. 12, 2013

(87) PCT Pub. No.: WO2012/047034
PCT Pub. Date: Apr. 12, 2012

(65) Prior Publication Data
US 2013/0180453 A1    Jul. 18, 2013

(30) Foreign Application Priority Data
Oct. 6, 2010    (KR) .................. 10-2010-0097150

(51) Int. Cl.
*C23C 16/50* (2006.01)
*H01L 21/02* (2006.01)
(Continued)

(52) U.S. Cl.
CPC ............. *C23C 16/50* (2013.01); *C23C 16/4412* (2013.01); *C23C 16/45504* (2013.01);
(Continued)

(58) Field of Classification Search
USPC ................... 118/715; 156/345.33, 34
See application file for complete search history.

(56) References Cited

U.S. PATENT DOCUMENTS 5,824,605 A * 10/1998 Chen et al. .................... 438/729
5,916,369 A * 6/1999 Anderson et al. ............. 118/715
(Continued)

FOREIGN PATENT DOCUMENTS

JP    2005-328021 A    11/2005
JP    2009-283765 A    12/2009
(Continued)

*Primary Examiner* — Gordon R Baldwin
*Assistant Examiner* — Mirza Israr Javed
(74) *Attorney, Agent, or Firm* — Rabin & Berdo, P.C.

(57) ABSTRACT

Provided is a substrate processing apparatus. The substrate processing apparatus includes a chamber where processes with respect to a substrate are carried out, a substrate support on which the substrate is placed, the substrate support being disposed within the chamber, and an antenna disposed in an upper portion of the chamber to form an electric field within the chamber. The antenna includes a first antenna and a second antenna, which are disposed in rotational symmetry with respect to a preset center. The first antenna includes a first inner antenna and a first intermediate antenna which respectively have semi-circular shapes and first and second radii and are respectively disposed on one side and the other side with respect to the preset center line and a first connection antenna connecting the first inner antenna to the first intermediate antenna. The second antenna includes a second intermediate antenna and a second inner antenna which respectively have semi-circular shapes and have first and second radii and are respectively disposed on one side and the other side with respect to the center line and a second connection antenna connecting the second intermediate antenna to the second inner antenna.

7 Claims, 18 Drawing Sheets

(51) Int. Cl.

| | |
|---|---|
| *C23C 16/455* | (2006.01) |
| *H01J 37/32* | (2006.01) |
| *C23C 16/507* | (2006.01) |
| *H01L 21/321* | (2006.01) |
| *C23C 16/44* | (2006.01) |
| *H05H 1/46* | (2006.01) |

(52) U.S. Cl.
CPC ..... *C23C16/45536* (2013.01); *C23C 16/45563* (2013.01); *C23C 16/507* (2013.01); *H01J 37/3211* (2013.01); *H01J 37/32449* (2013.01); *H01L 21/02617* (2013.01); *H01L 21/3211* (2013.01); *H01L 21/32105* (2013.01); *H05H 1/46* (2013.01); *H05H 2001/4667* (2013.01)

(56) References Cited

U.S. PATENT DOCUMENTS

| | | |
|---|---|---|
| 7,125,758 B2 | 10/2006 | Choi et al. |
| 7,754,294 B2 | 7/2010 | Choi et al. |
| 7,785,672 B2 | 8/2010 | Choi et al. |
| 7,884,035 B2 | 2/2011 | Park et al. |
| 8,074,599 B2 | 12/2011 | Choi et al. |
| 8,083,853 B2 | 12/2011 | Choi et al. |
| 2003/0203125 A1* | 10/2003 | Tei et al. ............. 427/575 |
| 2004/0099378 A1* | 5/2004 | Kim .............. C23C 16/4558 156/345.33 |
| 2005/0233092 A1 | 10/2005 | Choi et al. |
| 2005/0233595 A1 | 10/2005 | Choi et al. |
| 2005/0251990 A1 | 11/2005 | Choi et al. |
| 2005/0255257 A1 | 11/2005 | Choi et al. |
| 2006/0005771 A1 | 1/2006 | White et al. |
| 2006/0019502 A1 | 1/2006 | Park et al. |
| 2006/0228496 A1 | 10/2006 | Choi et al. |
| 2006/0236934 A1 | 10/2006 | Choi et al. |
| 2008/0020146 A1 | 1/2008 | Choi et al. |
| 2008/0268175 A1 | 10/2008 | Park et al. |
| 2008/0268176 A1 | 10/2008 | Choi et al. |
| 2009/0162260 A1* | 6/2009 | Bera .............. H01J 37/321 422/186.04 |
| 2009/0255759 A1 | 10/2009 | Barnes |
| 2009/0291563 A1 | 11/2009 | Ishibashi |
| 2011/0095402 A1 | 4/2011 | Park et al. |
| 2013/0186337 A1* | 7/2013 | Je et al. ............. 118/723 R |

FOREIGN PATENT DOCUMENTS

| | | | |
|---|---|---|---|
| KR | 10-0391063 B1 | | 7/2003 |
| KR | 20050040274 | * | 3/2005 |
| KR | 10-2005-0040274 A | | 5/2005 |

* cited by examiner

SUBSTRATE PROCESSING DEVICE EQUIPPED WITH SEMICIRCLE SHAPED ANTENNA

TECHNICAL FIELD

The present invention disclosed herein relates to a substrate processing apparatus, and more particularly, to a substrate processing apparatus including a semicircle-type antenna.

BACKGROUND ART

Typically, a semiconductor device includes a plurality of layers on a silicon substrate, which are deposited on the silicon substrate through a deposition process. Such deposition process has several important issues, which are important in evaluating the deposited layers and selecting the deposition process.

First, an example of the issues is 'quality' of the deposited layer. The 'quality' represents composition, contamination levels, defect density, and mechanical and electrical properties. The composition of each of the layers may be changed according to conditions of the deposition process. This is very important for obtaining a specific composition.

Second, another example of the issues is a uniform thickness over the wafer. Specifically, a thickness of a film deposited on a pattern having a non-planar shape with a stepped portion is very important. Here, whether the thickness of the deposited film is uniform may be determined through a step coverage which is defined as a ratio of a minimum thickness of the film deposited on the stepped portion divided by a thickness of the film deposited on the pattern.

Another issue respect to the deposition is a filling space. This represents a gap filling in which an insulating layer including an oxide layer is filled between metal lines. A gap is provided to physically and electrically isolate the metal lines from each other.

Among the issues, uniformity is one of very important issues with respect to the deposition process. A non-uniform layer may cause high electrical resistance on the metal lines to increase possibility of mechanical damage.

DISCLOSURE

Technical Problem

The present invention provides a plasma processing apparatus in which process uniformity is secured and a plasma antenna.

Technical Solution

Embodiments of the present invention provide substrate processing apparatuses including: a chamber where processes with respect to a substrate are carried out; a substrate support on which the substrate is placed, the substrate support being disposed within the chamber; and an antenna disposed in an upper portion of the chamber to form an electric field within the chamber, wherein the antenna includes a first antenna and a second antenna, which are disposed in rotational symmetry with respect to a preset center, the first antenna includes a first inner antenna and a first intermediate antenna which respectively have semi-circular shapes and first and second radii and are respectively disposed on one side and the other side with respect to the preset center line and a first connection antenna connecting the first inner antenna to the first intermediate antenna, and the second antenna includes a second intermediate antenna and a second inner antenna which respectively have semi-circular shapes and have first and second radii and are respectively disposed on one side and the other side with respect to the center line and a second connection antenna connecting the second intermediate antenna to the second inner antenna.

In some embodiments, the first antenna may further include a semicircular-type first outer antenna having a third radius and disposed on one side of the center line, the second antenna may further include a semicircular-type second outer antenna having the third radius and disposed on the other side of the center line, the first intermediate antenna may be disposed between the second inner antenna and the second outer antenna, and the second intermediate antenna may be disposed between the first inner antenna and the first outer antenna.

In other embodiments, the antenna may have a flat shape on which the first and second antennae are flush with each other.

In still other embodiments, the chamber may include a lower chamber having an opened upper side, a chamber cover disposed under the antenna to open and close the upper side of the lower chamber, and an adjustment plate disposed between the antenna and the chamber cover to adjust the electric field formed within the chamber.

In even other embodiments, a thickness of the adjustment plate may be determined by a process rate within the chamber.

In yet other embodiments, the substrate processing apparatus may further include a showerhead in which an inlet for supplying reaction gas into the chamber and an outlet for discharging the reaction gas supplied into the chamber are disposed in symmetry to each other, wherein the showerhead may include a plurality of diffusion passages connected to the inlet and having a sectional area increasing along a flow direction of the reaction gas, and inflow connection passages connecting the diffusion passages to each other.

In further embodiments, the diffusion passages may be vertically disposed.

In still further embodiments, the showerhead may include a plurality of convergent passages connected to the outlet and having a sectional area decreasing along a flow direction of the reaction gas and outflow connection passages connecting the convergent passages.

Advantageous Effects

According to the embodiments of the present invention, plasma having a uniform density may be generated in the chamber. Also, the process uniformity with respect to the object to be processed may be secured using the plasma.

DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

BEST MODE

Figure 1:
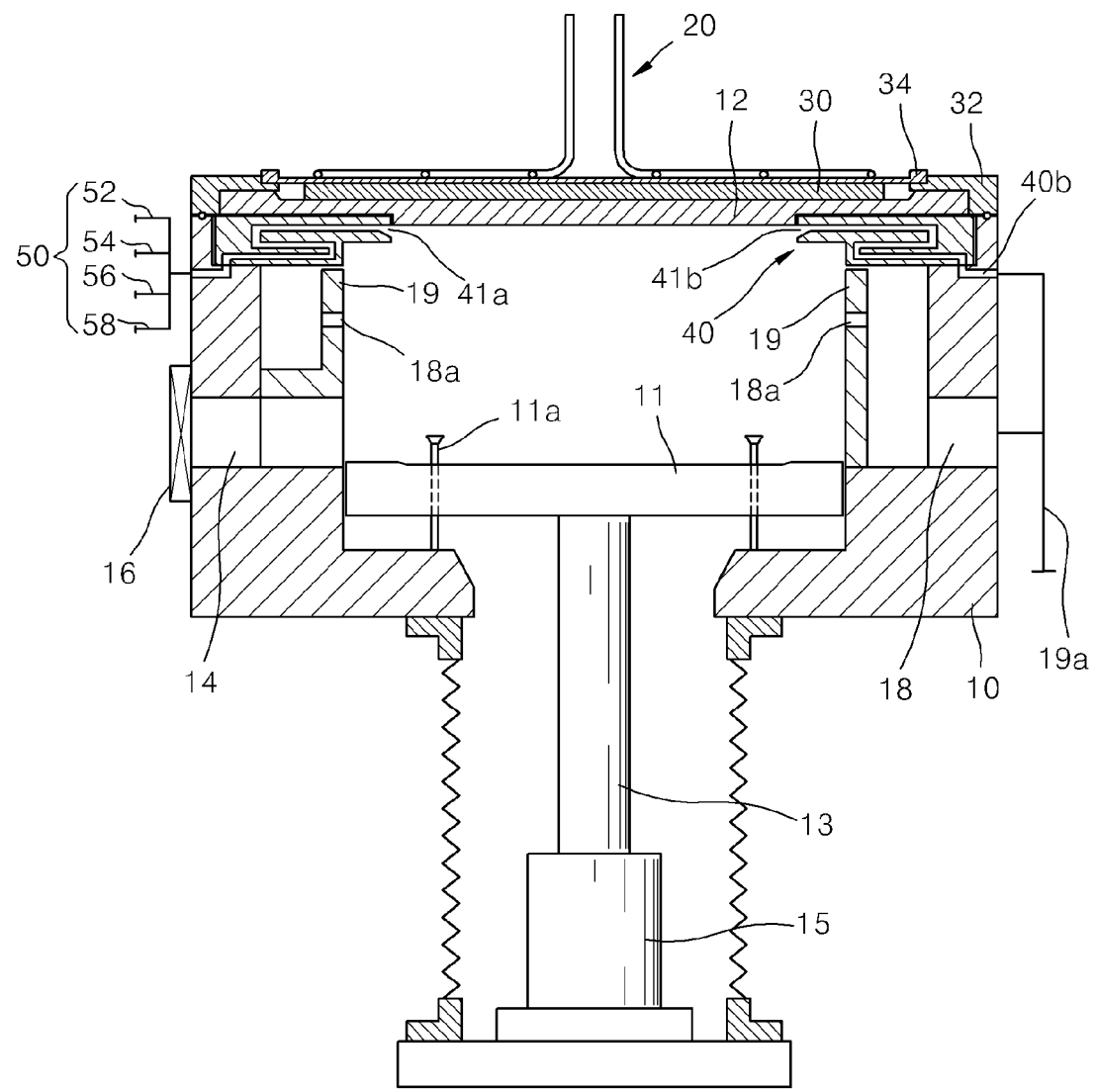
FIGS. 1 and 2 are schematic views of a substrate processing apparatus according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the dimensions of elements are exaggerated for clarity of illustration, like reference numerals refer to like elements.

Figure 2:
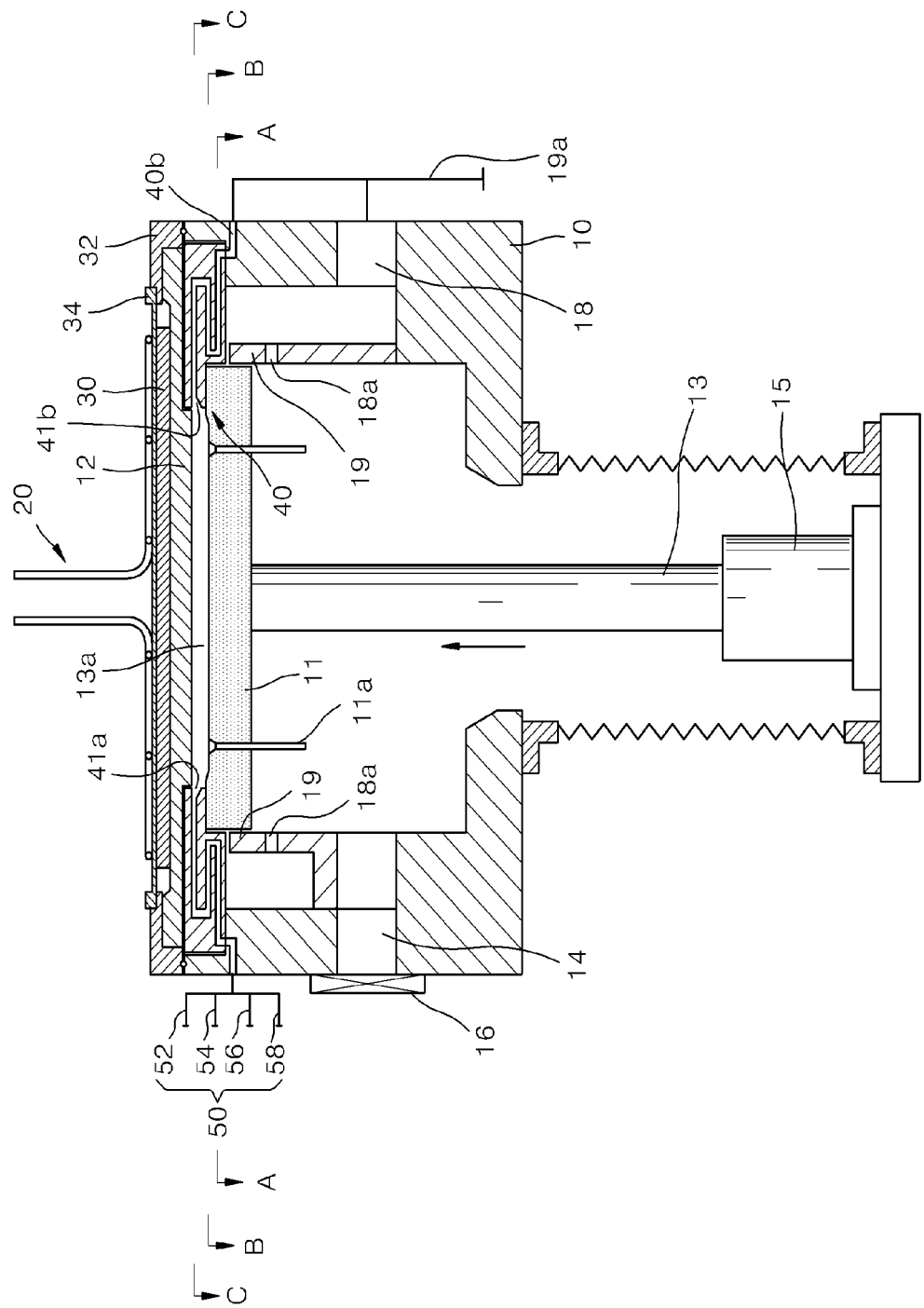

FIGS. 1 and 2 are schematic views of a substrate processing apparatus according to an embodiment of the present invention. As illustrated in FIGS. 1 and 2, the substrate processing apparatus includes a chamber where processes with respect to a substrate are carried out. The chamber provides an inner space isolated from the outside to isolate the substrate from the outside while the processing is in progress. The chamber includes a lower chamber 10, which has an opening in an upper portion and a chamber cover 12 for opening or closing the upper portion of the lower chamber 10. The chamber cover 12 is fixed to the upper portion of the lower chamber 10 by a fixing ring 32.

The lower chamber 10 includes a passage 14 disposed in a sidewall. The substrate is accessible into/from the lower chamber 10 through the passage 14. The passage 14 is opened or closed by a gate valve 16 disposed on the outside of the lower chamber 10. An exhaust hole 18 is defined in the other sidewall of the lower chamber 10, and the exhaust hole 18 is connected to an exhaust line 19a. The exhaust line 19a is connected to a vacuum pump (not shown). The exhaust line 19a may discharge gas into the lower chamber 10 through the exhaust hole 18 to form a vacuum condition in the lower chamber 10 in a process just after the substrate is carried into the lower chamber 10 to perform the processes.

The substrate is moved into the lower chamber through the passage 14 opened by the gate valve 16. Also, the substrate is placed on a support 11 disposed in the inner space. As illustrated in FIG. 1, the support 11 is disposed at a lower portion (release position) of the lower chamber 10. A plurality of lift pins 11a are provided on the support 11. The plurality of lift pins 11a support the substrate moved onto the support 11 in an erect state. With the support 11 placed at the lower portion of the lower chamber 10, lower ends of the lift pins 11a are supported by a lower wall of the lower chamber 10 and upper ends of the lift pins 11a remain protruding from a top surface of the support 11. Thus, the substrate is spaced from the support 11 by the lift pins 11a.

The support 11 is connected to an elevating shaft 13. The elevating shaft 13 is moved upward and downward by a driving unit 15. The elevating shaft 13 may be connected to the driving unit 15 through the opened lower portion of the lower chamber 10 and vertically move the support 11 by using the driving unit 15.

As illustrated in FIG. 2, the support may ascend and be moved up to a neighborhood of a showerhead 40 (process position). A process area 13a contacting lower ends of both protrusions of the showerhead 40 and surrounded by the support 11 and the chamber cover 12 may be defined on the support 11. The support 11 may include a temperature adjustment system (for example, a heater) for adjusting a temperature of the substrate. As described below, the processing of the substrate placed on the support 11 is carried out only in the process area 13a. Also, process gas or purge gas may be supplied only onto the process area 13a. Here, the upper ends of the lift pins 11a may be inserted into the support 11 as the support 11 ascends, and the substrate may be seated on the top surface of the support 11.

A guide 19 is disposed on the outside of the support 11 and disposed along an elevating direction of the support 11. The guide 19 includes a guide hole 18a communicating with the exhaust hole 18. Also, the guide discharges the gas within the lower chamber 10 through the guide hole 18a and the exhaust hole 18 while the processing is in progress to adjust a pressure within the lower chamber 10.

Figure 3:
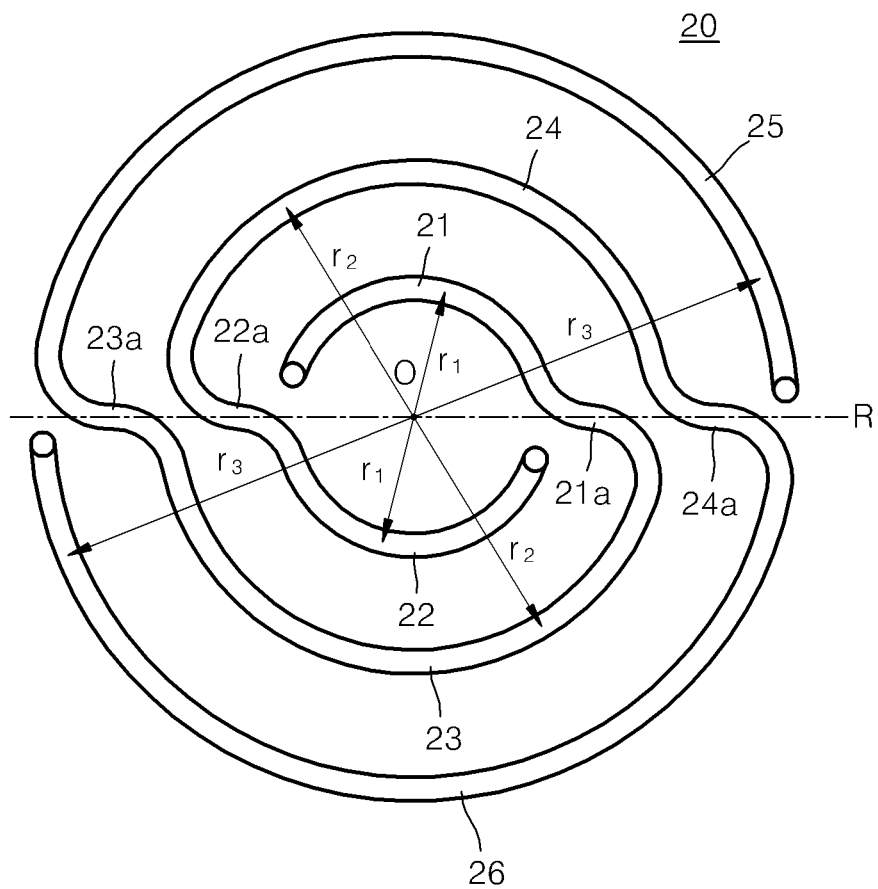
FIG. 3 is a schematic plan view of an antenna of FIG. 1.

The antenna 20 is disposed at the upper portion of the chamber cover 12. The antenna 20 is connected to each of RF power sources (not illustrated) to form electric fields in the process area 13a and generate plasma from the reaction gas supplied into the process area 13a. FIG. 3 is a schematic plan view illustrating the antenna of FIG. 1.

As illustrated in FIG. 3, the antenna 20 includes first and second antennae integrated with each other. The first and second antennae are in 180-degree rotational symmetry with respect to a center line R. The first antenna includes a first inner antenna 21, a first intermediate antenna 23, and a first outer antenna 25, which each has a half circle shape with respect to a center. The first inner antenna 21 has a first radius r1, the first intermediate antenna 23 has a second radius r2, and the first outer antenna 25 has a third radius r3 (r1<r2<r3). Here, a first inner connection antenna 21a connects the first inner antenna 21 to the first intermediate antenna 23, and a first outer connection antenna 23a connects the first intermediate antenna 23 to the first outer antenna 25.

Likewise, the second antenna includes a second inner antenna 22, a second intermediate antenna 24, and a second outer antenna 26, which each has a half circle shape with respect to the center. The second inner antenna 22 has a first radius r1, the second intermediate antenna 24 has a second radius r2, and the second outer antenna 26 has a third radius r3 (r1<r2<r3). Here, a second inner connection antenna 22a connects the second inner antenna 22 to the second intermediate antenna 24, and a second outer connection antenna 24a connects the second intermediate antenna 24 to the second outer antenna 26.

The first and second antennae are connected to each of separate RF power sources (not illustrated). When an RF current flows into the first and second antennae through the RF power sources, the first and second antennae form electric fields within a lower chamber 10. Here, the first and second antennae may form a uniform electric field within the lower chamber 10 through mutual supplementation therebetween.

As illustrated in FIG. 3, the first and second antennae are disposed alternately along a radial direction from a center O. That is, the first intermediate antenna 23 is disposed between the second inner antenna 22 and the second outer antenna 26, and the second intermediate antenna 24 is disposed between the first inner antenna 21 and the first outer antenna 25. Thus, when the electric field formed by the first antenna is weaker than the electric field formed by the second antenna, the electric field formed by the first antenna may be reinforced by an electric field formed by the adjacent second antenna. On the other hand, when the electric field formed by the first antenna is stronger than the electric field formed by the second antenna, the electric field formed by the first antenna may be offset by the electric field formed by the adjacent second antenna. Therefore, even though there is a difference between the intensities of the electric fields formed by the first and second antennae, a uniform electric field may be formed through inter-electric field constructive interference.

As illustrated in FIG. 1, the adjustment plate 30 is disposed between the chamber cover 12 and the antenna 20. The adjustment plate 30 is placed between the chamber cover 12 and a lock plate 34. The lock plate 34 is fixed to the fixing ring 32 to fix the adjustment plate 30. The adjustment plate 30 is formed of a dielectric material, and the electric field formed by the antenna 20 may be adjusted by the thickness of the adjustment plate 30.

Figure 4:
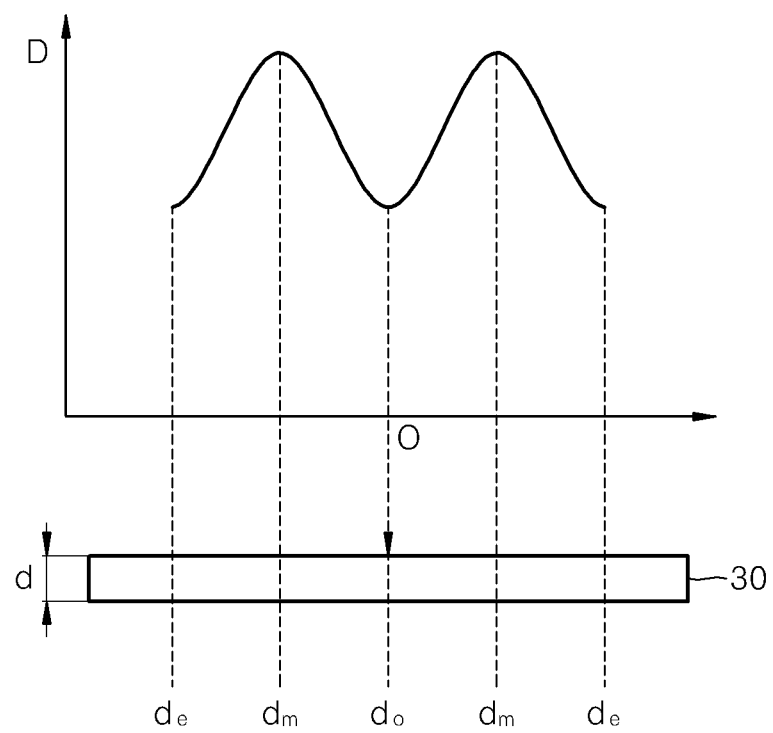
FIG. 4 is a graph showing a relationship between a thickness of an adjustment plate of FIG. 1 and a deposition rate of a substrate.

FIG. 4 is a graph showing relations between the deposition rate of a substrate and the thickness of an adjustment plate of FIG. 1. As illustrated in the upper part of FIG. 4, a deposition rate D after a deposition process is completed is low at the center O and the edge of the substrate and high between the center O and the edge of the substrate. Therefore, the deposition uniformity of the substrate may be improved by using the adjustment plate 30.

The adjustment plate 30 acts as a resistance against the electric field formed by the antenna 20. The more the adjustment plate 30 is thick in thickness, the more the electric field formed by the antenna 20 is weak. As a result, the deposition rate may decrease. Using this property, the deposition uniformity of the substrate may be improved by adjusting the thickness of the adjustment plate 30. As illustrated in FIG. 4, the deposition uniformity may be improved by making thicknesses d0 and de of the center O and the edge of the substrate, where the deposition rate is low, larger than a thickness dm between the center O and edge of the substrate to adjust the size of the electric field. The deposition rate and the thickness of the adjustment plate 30 shown in FIG. 4 are to give an example and thus may have values different from those of FIG. 4.

Referring to FIG. 1, the substrate processing apparatus further includes the showerhead 40. The showerhead 40 is disposed between the lower chamber 10 and the chamber cover 12. The showerhead 40 not only supplies the process gas or the purge gas into the process area 13a, but also discharges the supplied process gas or purge gas into the outside. For this, the showerhead 40 includes an inlet 41a and an outlet 41b. The inlet 41a and the outlet 41b are disposed symmetrically at one side and the other side, respectively.

Figure 5:
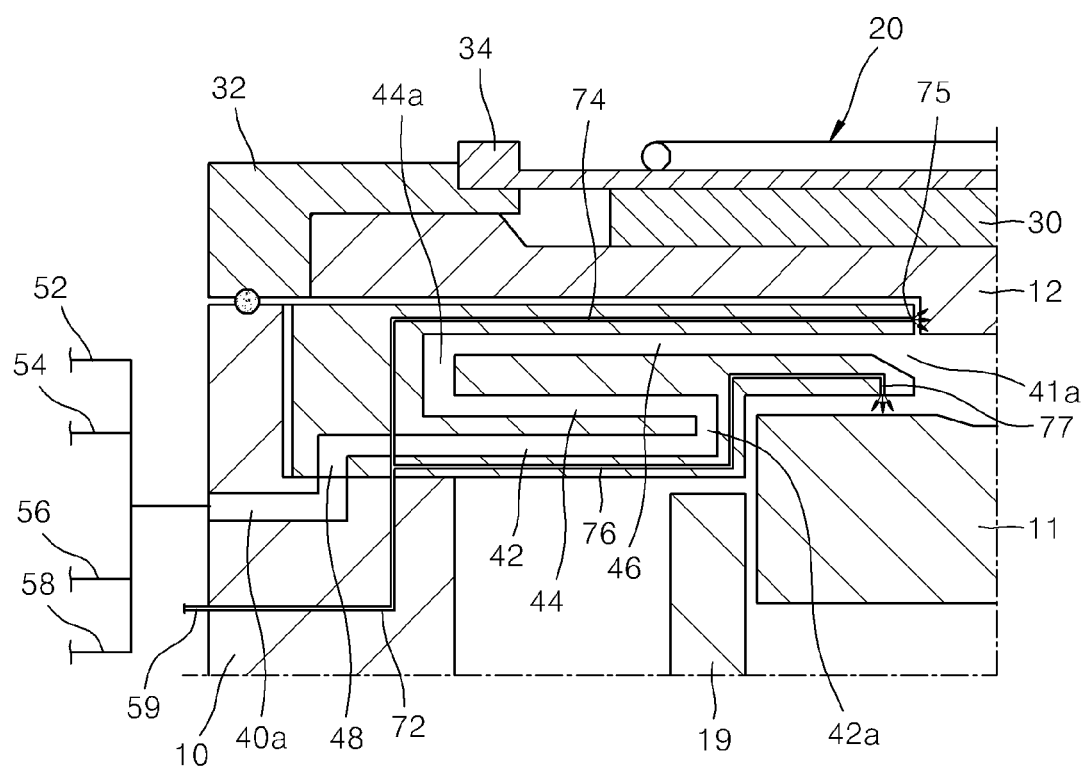
FIG. 5 is an enlarged view illustrating an inlet of a showerhead of FIG. 2.

FIG. 5 is an enlarged view illustrating the inlet of the showerhead of FIG. 2. As illustrated in FIG. 5, the showerhead 40 includes a plurality of diffusion passages 42, 44, and 46 and a plurality of inflow connection passages 42a and 44a connecting the diffusion passages 42, 44, and 46. The diffusion passages 42, 44, and 46 are disposed roughly horizontally parallel to one another. Also, the diffusion passages 42, 44, and 45 are horizontally stacked with each other. The lower diffusion passage 42 is connected to a connection line 40a through an entrance 48 disposed in the lower chamber 10. The connection line 40a is connected to a supply line 50.

In atomic layer deposition (ALD), two or more process gases such as a film precursor and reducing gas are introduced alternately and successively while the substrate is heated to form a single layer at a time. The film precursor is absorbed into a surface of the substrate in a first process and reduced to form a predetermined layer in a second process. As described above, since the two process gases are used alternately in a chamber, the deposition process is carried out at a relatively slow rate. In plasma enhanced atomic layer deposition (PEALD), plasma is generated while the reducing gas is introduced to generate reduced plasma. Until now, the ALD and PEALD processes may provide improved uniformity with respect to the thickness of the layer and suitability with respect to a main part on which the layer is deposited in spite of the demerit in which the deposition rate is slower than those of chemical vapor deposition (CVD) and plasma enhanced chemical vapor deposition (PECVD).

The supply line 50 includes first and second reaction gas lines 52 and 54, a purge gas line 56, and a plasma line 58, which are supplied to the showerhead 40 through the connection line 40a. The upper diffusion passage 46 is connected to the inlet 41a, and the process gas or purge gas supplied through the supply line 50 is supplied to the process area 13a through the inlet 41a after passing through the diffusion passages 42, 44, and 46 in order.

The first reaction gas line 52 supplies first reaction gas, and the first reaction gas may include a film precursor such as a composition having major atomic or molecular species found in the film formed on the substrate. For example, the film precursor having a solid, liquid, or gas phase may be supplied to the showerhead 40 in a gas phase. During a predetermined cycle while the processing is in progress, the first reaction gas is supplied to the process area 13a, and the first reaction gas is absorbed into the substrate in a single layer. Then, the purge gas is purged from the process area 13a through the purge gas line 56 described below.

The second reaction gas line 54 supplies second reaction gas, and the second reaction gas may include a reducing agent. For example, the reducing agent having a solid, liquid, or gas phase may be supplied to the showerhead 40 in a gas phase. When the purging is finishes while the process is in progress, the reducing gas is supplied to the process area 13a during a predetermined cycle and a radio frequency (RF) current is supplied to an antenna 20. As a result, the second reaction gas supplied through the second reaction gas line 54 may be ionized or dissociated. Thus, a dissociated species which may form a film by reacting with the film precursor may be formed to reduce the film precursor by the first reaction gas. The first and second reaction gases may be supplied alternately, and the alternate supply may be cyclical or non-cyclical by varying a time interval between the supply of the first reaction gas and the supply of the second reaction gas.

The purge gas line 56 may supply the purge gas to the showerhead 40 between the supply of the first reaction gas and the supply of the second reaction gas. The purge gas may include inert gas such as noble gas (i.e. helium, neon, argon, xenon, and krypton), nitrogen (or nitrogen-containing gas), hydrogen (or hydrogen-containing gas). The plasma line 58 may supply remote plasma selectively to the showerhead 40. The remote plasma is supplied into the chamber to clean the inside of the chamber.

Figure 6:
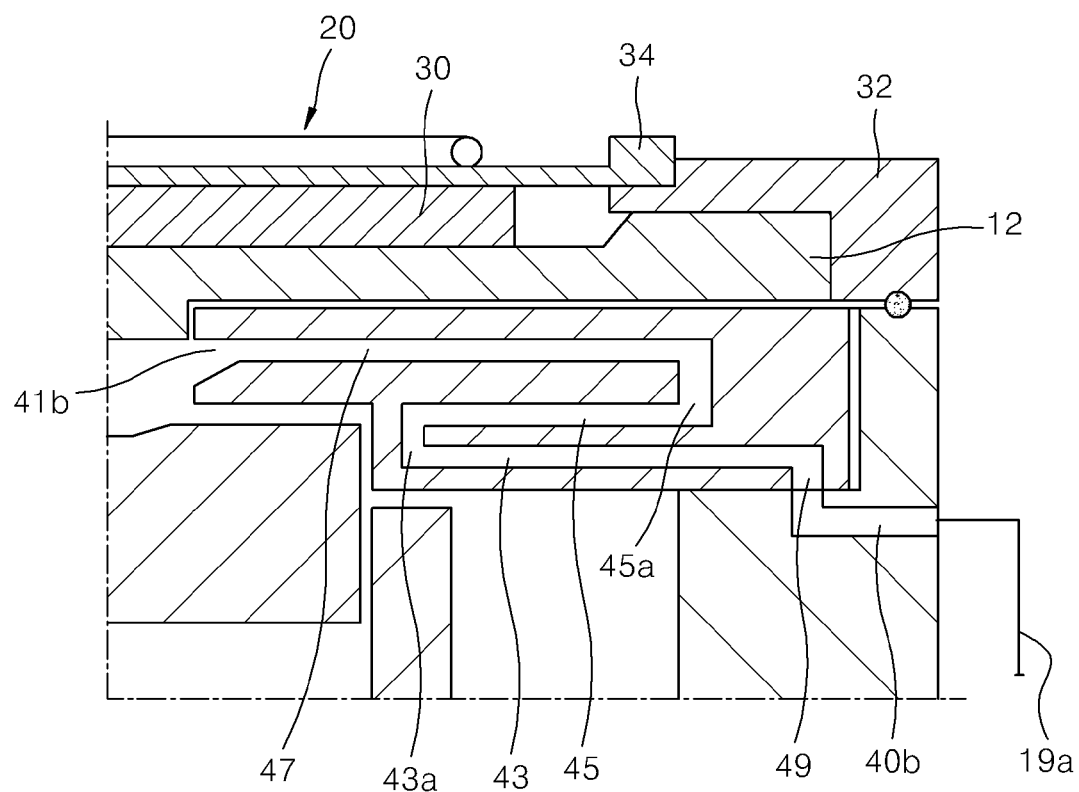
FIG. 6 is an enlarged view illustrating an outlet of the showerhead of FIG. 2.

FIG. 6 is an enlarged view illustrating an outlet of the showerhead of FIG. 2. As illustrated in FIG. 6, the showerhead 40 includes a plurality of convergent passages 43, 45, and 47 and outflow connection passages 43a and 45a connecting the convergent passages 43, 45, and 47 to each other. The convergent passages 43, 45, and 47 are disposed roughly horizontally parallel to one another and vertically stacked with one another. The lower convergent passage 43 is connected to a connection line 40b disposed in the lower chamber 10 through an exit 49. The connection line 40b is connected to the exhaust line 19a. The upper convergent passage 47 is connected to the outlet 41b, and the process gas or purge gas supplied into the process area 13a successively passes through the convergent passages 43, 45, and 47 through the outlet 41b, and then is discharged through the exhaust line 19a.

Figure 7A:
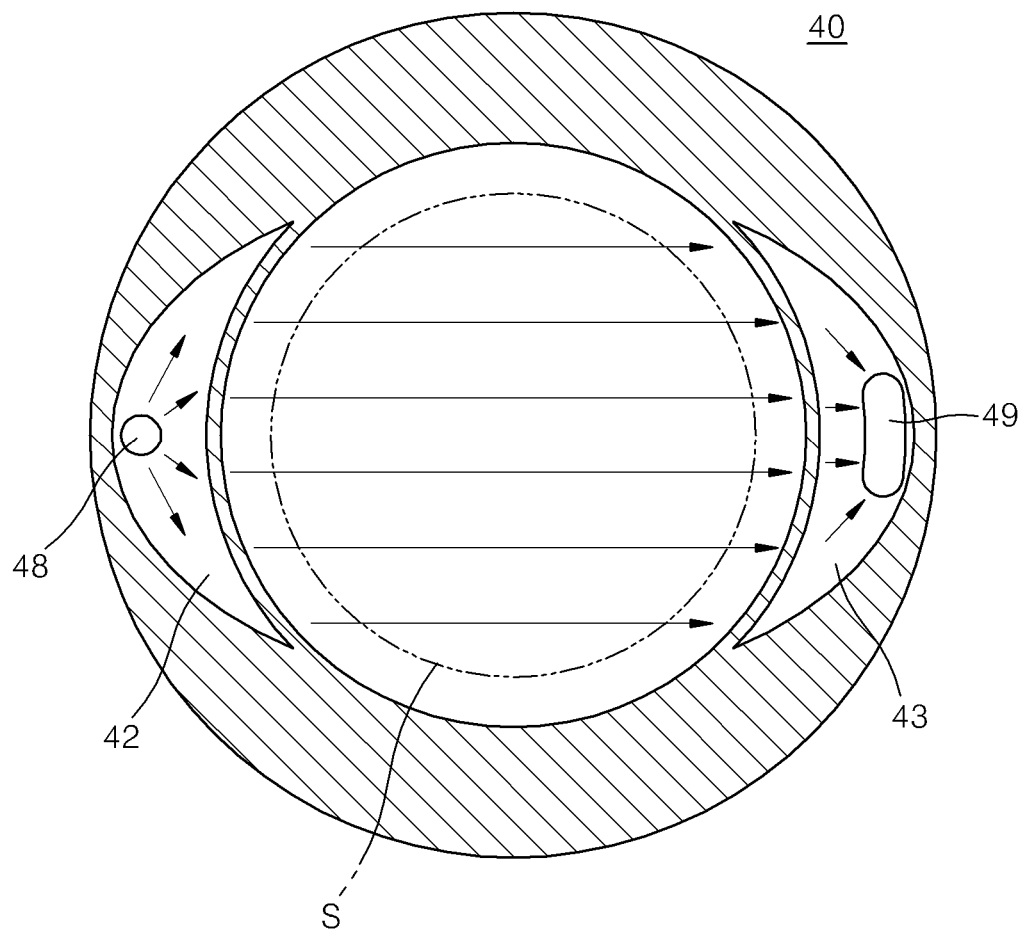
FIGS. 7a through 7c are views illustrating a flow by the showerhead of FIG. 1.
Figure 7B:
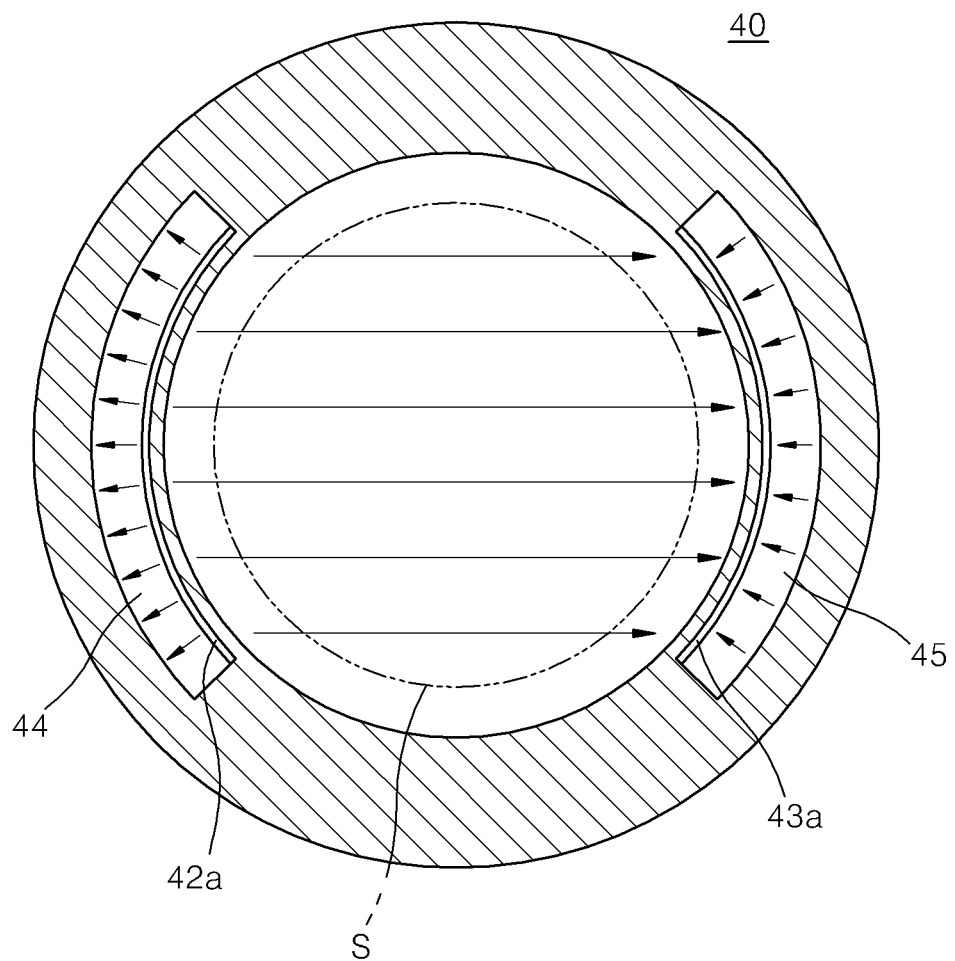
Figure 7C:
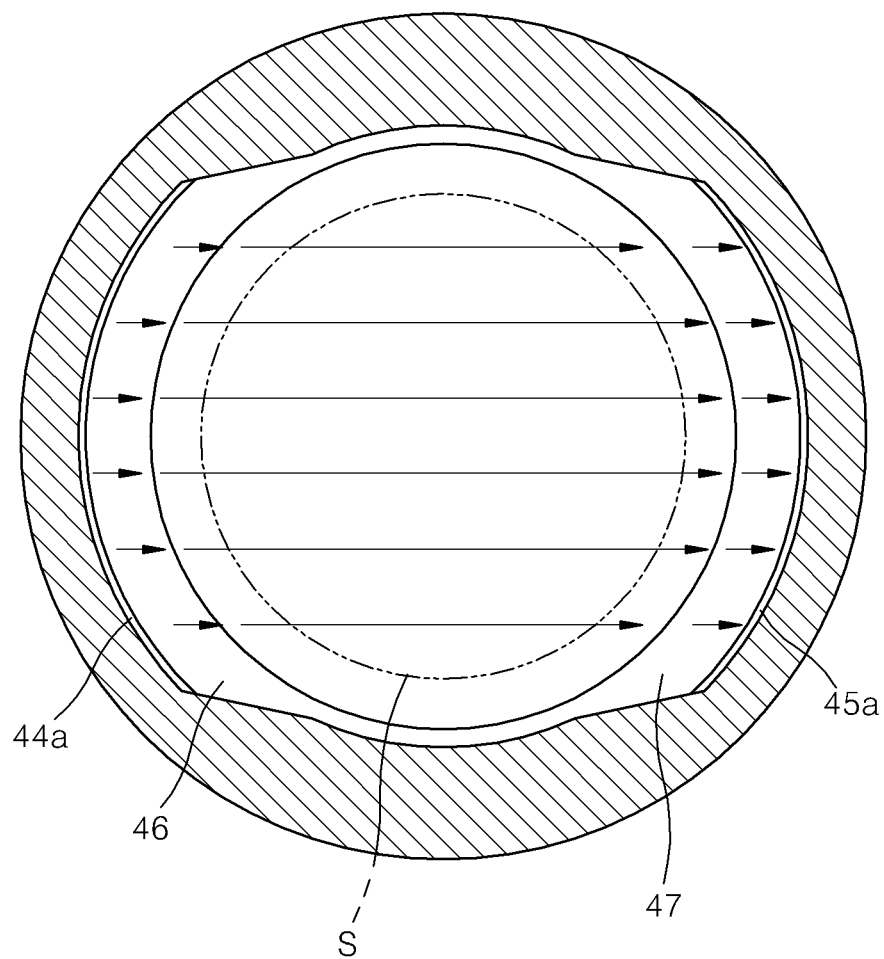

FIGS. 7a through 7c are views illustrating flow by the showerhead of FIG. 1. The shapes of the abovementioned diffusion passages 42, 44, and 46 and the convergent passages 43, 45, and 47 and a flow there through will be described with reference to FIGS. 5 through 7c.

As described above, during the ALD, the first reaction gas is supplied to absorb the first reaction gas into the substrate. Then, the purge gas is supplied to remove the first reaction gas or byproducts. Thereafter, the second reaction gas is supplied to allow the second reaction gas to react with the first reaction gas, thereby depositing the atomic layer. Then, the purge gas is supplied again to remove the second reaction gas or byproducts. That is, the two process gases are successively supplied and then removed.

In general, reaction gases are supplied simultaneously to form a thin film during CVD. Thus, it is unsuitable for a method in which a thin film is formed through the discontinuous supply of reaction gases or a method in which successively supplied reaction gases react with each other in while being purged so that no gas phase reaction takes place in a chamber. Also, in a general apparatus using the CVD, reaction gas are uniformly supplied on a substrate from top to bottom by using a showerhead. However, since such structure has a complicated flow of process gas and requires a large reaction volume, it is difficult to switch the supply of process gas swiftly.

FIG. 7a is a sectional view taken along line A-A of FIG. 2. As illustrated in FIG. 5a, the showerhead 40 has a hollow ring shape, and a central portion thereof is positioned corresponding to a substrate S. The antenna 20 may form an electric field on the upper portion of the substrate S through the central portion of the showerhead 40. The lower diffusion passage 42 and the entrance 48 are disposed at positions opposite to those of the lower convergent passage 43 and the exit 49, and the substrate S is disposed between them. The entrance 48 is connected to the supply line 50, and the process gas or purge gas is introduced through the supply line 50. The exit 49 is connected to the exhaust line 19a, and the process gas or purge gas is discharged through the exhaust line 19a. Therefore, as illustrated in FIG. 7a, a flow of the gas traveling from the entrance 48 to the exit 49 is formed on the upper portion of the substrate S. Also, as described below, the flow is uniformly formed because of the shapes of the diffusion passages 42, 44, and 46 and the convergent passages 43, 45, and 47.

As illustrated in FIG. 7a, the lower diffusion passage 42 communicates with the entrance 48, and the gas supplied through the supply line 50 is diffused in an arrow direction through the lower diffusion passage 42 after being introduced through the entrance 48. Here, a sectional area of the lower diffusion passage 42 increases gradually (or continuously) along a flow direction (or the arrow direction) of the gas, and thus the gas may be diffused along the flow direction. Also, as illustrated in FIG. 7a, the lower convergent passage 43 communicates with the exit 49, and the gas introduced through the outlet 41b is converged in the arrow direction through the lower convergent passage 43 and travels toward the exit 49. Here, a sectional area of the lower convergent passage 43 decreases gradually (or continuously) along a flow direction (or the arrow direction. Thus, the gas may be converged in the flow direction.

FIG. 7b is a sectional view taken along line B-B of FIG. 2. As illustrated in FIG. 7b, the intermediate diffusion passage 44 communicates with the lower diffusion passage 42 through the inflow connection passages 42a, and the gas introduced through the lower diffusion passage 42 is diffused in the arrow direction through the intermediate diffusion passage 44. Here, a sectional area of the intermediate diffusion passage 44 increases gradually (or continuously) along the flow direction (or the arrow direction) of the gas, and thus the gas may be diffused in the flow direction. Also, as illustrated in FIG. 7b, the intermediate convergent passage 45 communicates with the lower convergent passage 43 through the outflow connection passage 43a, and the gas introduced through the outlet 41b is converged in the arrow direction through the intermediate convergent passage 45 and travels toward the outflow connection passage 43a. Here, a sectional area of the intermediate convergent passage 45 decreases gradually (or continuously) along the flow direction (or the arrow direction) of the gas, and thus the gas may be converged in the flow direction.

FIG. 7c is a sectional view taken along line C-C of FIG. 2. As illustrated in FIG. 7c, the upper diffusion passage 46 communicates with the intermediate diffusion passage 44 through the inflow connection passage 44a, and the gas introduced through the intermediate diffusion passage 44 is diffused in the arrow direction trough the upper diffusion passage 46. Here, a sectional area of the upper diffusion passage 46 increases gradually (or continuously) along the flow direction (or the arrow direction) of the gas, and thus the gas may be diffused in the flow direction. The diffused gas is supplied to the upper portion of the substrate S through the inlet 41a and parallely flows toward the outlet 41b. Also, as illustrated in FIG. 7c, the upper convergent passage 47 communicates with the intermediate convergent passage 45 through the outflow connection passage 45a, and the gas introduced through the outlet 41b is converged in the arrow direction through the upper convergent passage 47, and travels toward the outflow connection passage 45a. Here, a sectional area of the upper convergent passage 47 decreases gradually (or continuously) along the flow direction (or the arrow direction) of the gas, and thus the gas may be converged in the flow direction.

Referring again to FIG. 5 and FIGS. 7a through 7c, the gas supplied through the supply line 50 flows into the showerhead 40 through the entrance 48. Since the gas passes through the lower diffusion passage 42, the intermediate diffusion passage 44, and the upper diffusion passage 46, the flow direction may be changed from right to left and then to right, and simultaneously, the gas may be diffused as the sectional areas of the passages increases. That is, the gas may be sufficiently diffused while passing through the diffusion passages 42, 44, and 46. Thus, the gas supplied to the process area 13a through the inlet 41a may have a flow width corresponding to the substrate S.

Referring again to FIG. 6 and FIGS. 7a to 7c, each of the outlet 41b and the upper convergent passage 47 has a flow width corresponding to the substrate S. The exhaust pressure applied through the exit 49 is uniformly applied to an entire surface of the exit 41b through the convergent passages 43, 45, and 47. Therefore, the substrate S is disposed between the upper diffusion passage 46 and the upper convergent passage 47. Also, the gas introduced through the inlet 41a forms a uniform parallel flow toward the exit 41b on the upper portion of the substrate S. Then, since the gas passes through the upper convergent passage 47, the intermediate convergent passage 45, and the lower convergent passage 43, the flow direction may be changed from right to left and then to right, and simultaneously, the gas may be gradually diffused as the sectional areas of the passages increases. Thereafter, the gas is discharged through the exit 49 along the exhaust line 19a.

As described above, since the gas uniformly flows within the process area 13a, the gas may be swiftly supplied and discharged. Especially, two or more reaction gases and purge gases may be switched and supplied swiftly. Also, when the process area 13a has a minimized volume, the gases may be maximally swiftly switched.

Figure 8:
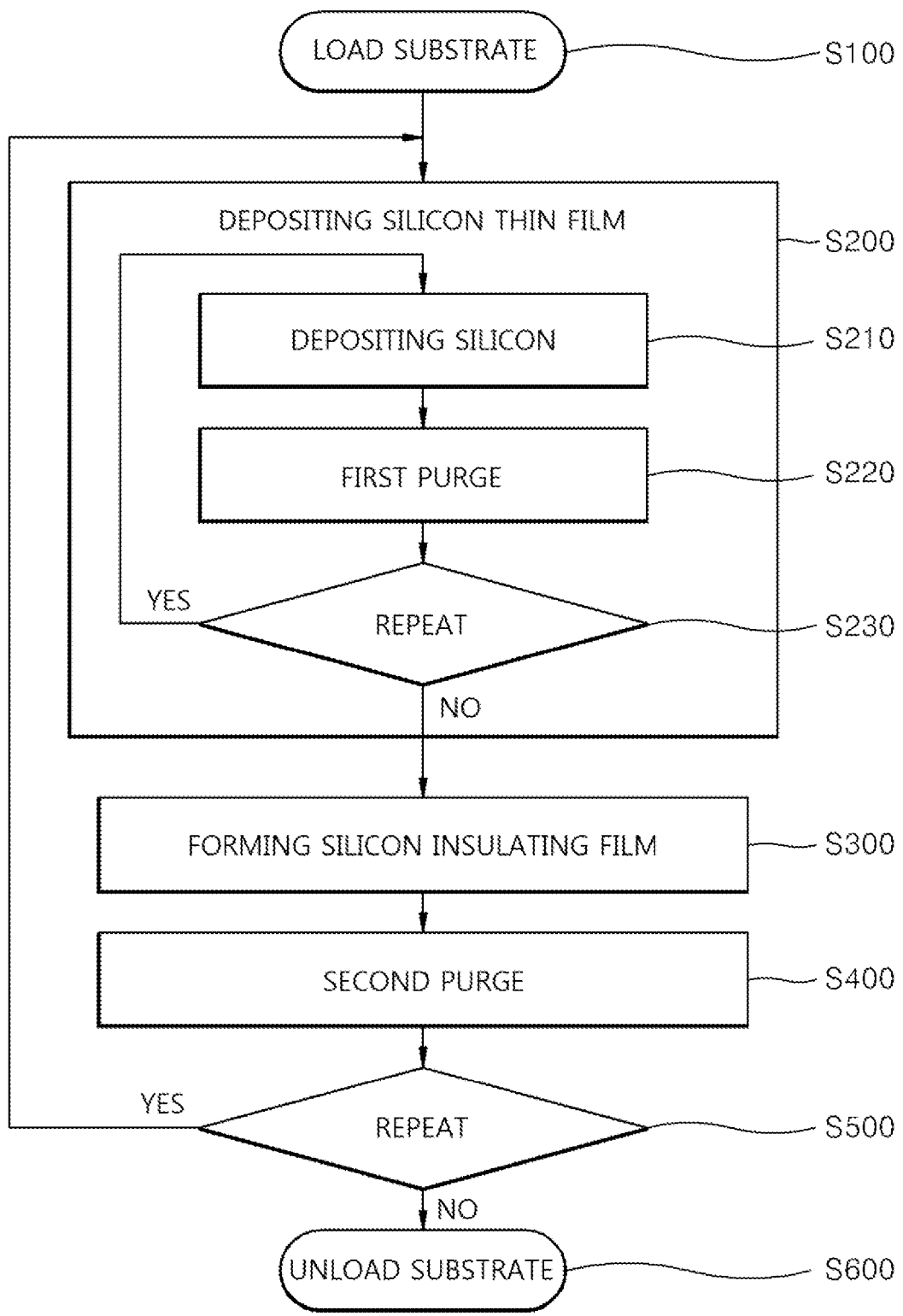
FIG. 8 is a flowchart illustrating a method of depositing a cyclic thin film according to an embodiment of the present invention.

FIG. 8 is a flowchart illustrating a method of depositing a cyclic thin film according to an embodiment of the present invention. Referring to FIG. 8, a substrate is loaded into a chamber of a semiconductor manufacturing apparatus S100. A silicon thin film is deposited on the substrate loaded into the chamber S200, and in the step S200, a silicon deposition step S210 and a first purge step S220 are performed together to deposit the silicon think film.

In the step S210, silicon is deposited on the substrate by injecting a silicon (Si) precursor into the chamber to deposit silicon. After silicon is deposited on the substrate, the first purge step of removing a non-reacted silicon precursor and a reaction byproduct is performed in the step S220. And then, the silicon thin film is formed on the substrate by repeating S230 the silicon deposition step S210 and the first purge step S220.

The silicon deposition step S210 and the first purge step S220 may be repeated, for example, three to ten times. In each silicon deposition step S210, one or more silicon atomic layers may be performed. Consequently, by repeatedly performing the silicon deposition step S210 and the first purge step S220, the silicon thin film comprised of amorphous silicon or polysilicon having polycrystalline property may be formed on the substrate. The silicon thin film having amorphous silicon or polycrystalline property may have a thickness of several or tens of A.

Subsequently, an insulating film including silicon is formed from the silicon thin film formed on the substrate S300. For example, the insulating film including silicon may be a silicon oxide film or a silicon nitride film.

To form the insulating film including silicon from the silicon thin film, a reaction gas may be injected into the chamber to form plasma atmosphere inside the chamber. The reaction gas, for example, may be one or more gases selected from a group consisting of O2, O3, N2, and NH3.

If the insulating film including silicon is the silicon oxide film, the reaction gas may be a gas including an oxygen atom such as O2 or O3. If the insulating film including silicon is the silicon nitride film, the reaction gas may be a gas including a nitrogen atom such as N2 or NH3.

Alternatively, to form the insulating film including silicon, for example, the silicon oxide film from the silicon thin film, the plasma atmosphere may be formed in the chamber by using O2 or O3 as an ignition gas.

Alternatively, to form the insulating film including silicon, for example, the silicon nitride film from the silicon thin film, the plasma atmosphere may be formed in the chamber by using N2 or NH3 as an ignition gas.

Subsequently, a second purge step for removing a reacted byproduct and a reaction gas or an ignition gas from the chamber is performed in the step S400.

To obtain the insulating film including silicon having a desired thickness, the step of depositing the silicon thin film S200, the step forming the insulating film including silicon S300 and the second purge step S200 may be repeatedly performed When the insulating film including silicon and having the desired thickness is formed, the substrate may be unloaded from the chamber in a step S900.

Figure 9:
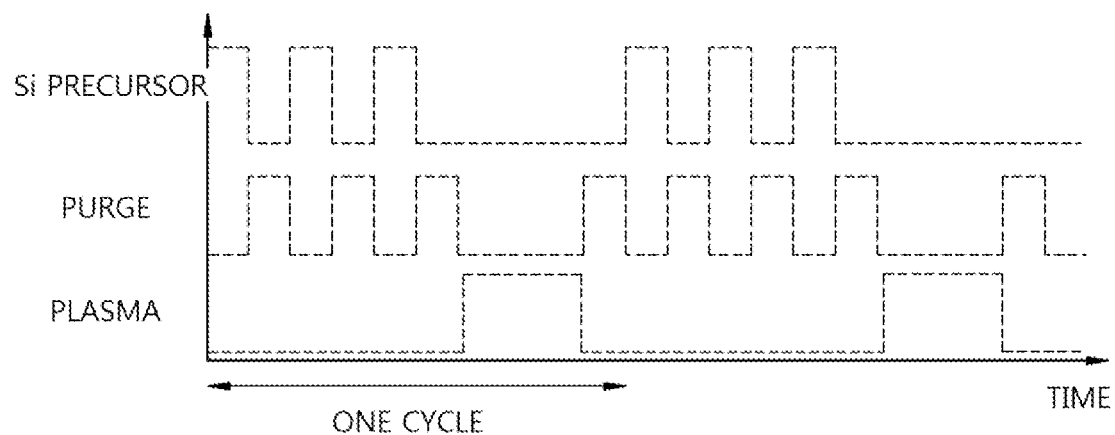
FIG. 9 is a diagram for describing a method of depositing a cyclic thin film according to an embodiment of the present invention.

FIG. 9 is a diagram describing a method of depositing a cyclic thin film according to an embodiment of the present invention. Referring to FIG. 9, the injection and purge of a silicon precursor are repeatedly performed. After the injection and purge of a silicon precursor are repeatedly performed, the plasma atmosphere is formed. In a state where the plasma atmosphere has been formed, a reaction gas may be injected as necessary.

As such, from the steps, in which the injection and purge of the silicon precursor are repeatedly performed, to the step, in which the plasma atmosphere is formed, is performed as one cycle. That is, the step of forming the insulating film including silicon by forming the plasma atmosphere after forming the silicon thin film by repeatedly performing the injection and purge of the silicon precursor is preformed as one cycle.

Accordingly, the method of depositing the cyclic thin film can be performed by repeatedly performing the injection and purge of the silicon precursor as well as by repeatedly performing the steps of forming the silicon thin film and forming the insulating film including silicon.

The method of depositing the cyclic thin film according to an embodiment of the present invention will be specifically described on a step-by-step with reference to FIG. 10A to 13 based on the above description. In the following description on FIG. 10A to 13, reference numbers of FIG. 8 to 9 may be used as necessary.

Figure 10A:
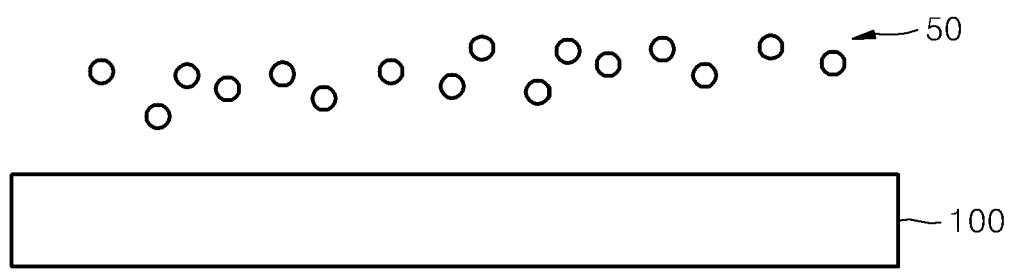
FIGS. 10A to 10C are sectional views illustrating a step of depositing silicon according to an embodiment of the present invention.
Figure 10B:
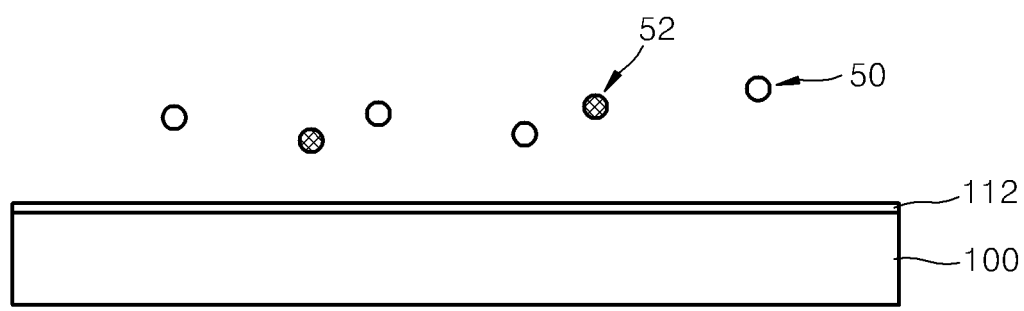
Figure 10C:
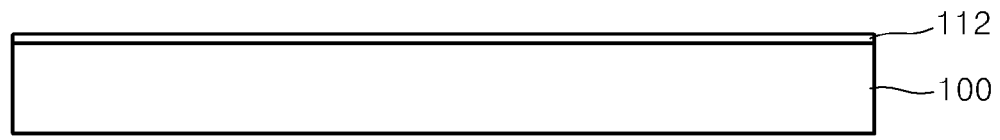

FIG. 10A to 10C are sectional views illustrating a step of depositing silicon according to an embodiment of the present invention. FIG. 10A is a sectional view illustrating a step of injecting a silicon precursor according to an embodiment of the present invention.

Referring to FIG. 10A, a silicon precursor 50 is injected into the chamber 10 into which the substrate 100 is loaded. The substrate 100, for example, may include a semiconductor substrate such as a silicon or compound semiconductor wafer.

Alternatively, the substrate 100 may include a substrate material, which differs from a semiconductor, such as glass, metal, ceramic and quartz.

The silicon precursor 50, for example, may be amino-based silane such as bisethylmethylaminosilane (BEMAS), bisdimethylaminosilane (BDMAS), BEDAS, tetrakisethylmethylaminosilane (TEMAS), tetrakisidimethylaminosilane (TDMAS), and TEDAS, chloride-based silane such as hexachlorinedisilane (HCD), or silan-based precursor including silicon and hydrogen.

The substrate 100 may be maintained at a temperature of about 50° C. to about 600° C. for reacting with the silicon precursor 50. Also, a pressure inside the chamber 10 into which the substrate 100 is loaded may be maintained about 0.05 Torr to about 10 Torr.

FIG. 10B is a sectional view illustrating a step of depositing silicon on the substrate according to an embodiment of the present invention. Referring to FIG. 10B, by a portion of the silicon precursors 50 reacting with the substrate 100, a silicon atom may be deposited on the substrate 100 and thus a silicon layer 112 may be formed. The silicon layer 112 may be formed of one or more silicon atomic layer.

A portion of the silicon precursors 50 may react with the substrate 100, thereby forming byproducts 52. Also, the other portion of the silicon precursors 50 may be remained in a non-reacted state without reacting with the substrate 100.

FIG. 10C is a sectional view illustrating a step of performing a first purge step according to an embodiment of the present invention. Referring to FIG. 10C, the silicon layer 112 is formed on the substrate 100 and then a purge step, which removes the remaining silicon precursors 50 in a non-reacted state and the reacted byproducts 52 from the chamber 10, may be performed. The purge step, which removes the remaining silicon precursors 50 and the reacted byproducts 52 from the chamber 10, may be called as a first purge step.

In the first purge step, the substrate 100 may be maintained at a temperature of about 50° C. to about 600° C. Also, a pressure inside the chamber 10 into which the substrate 100 is loaded may be maintained about 0.05 Torr to about 10 Torr. That is, a temperature of the substrate 100 and a pressure inside the chamber 10 may be constantly maintained during the step of depositing the silicon layer 112 and the first purge step.

Figure 11:
FIG. 11 is a sectional view illustrating a step of forming a silicon thin film including silicon according to an embodiment of the present invention.

FIG. 11 is a sectional view illustrating the step of depositing a silicon thin film according to an embodiment of the present invention. Referring to FIG. 11, by depositing a plurality of silicon layers 112, 114 and 116 on the substrate 100 by repeating the steps of FIG. 10A to 10C, the silicon thin film 110 comprising amorphous silicon or polysilicon having polycrystalline property is formed.

The silicon thin film 110 may have a thickness of several or tens of Å. The step of depositing the silicon thin film 110 and the first purge step may be repeatedly performed three to ten times such that the silicon thin film 110 includes three to ten silicon thin films 112, 114 and 116.

In this way, if the silicon thin film 110 is formed to include the plurality of silicon thin films 112, 114 and 116, the silicon thin film 110 can have excellent film properties and step coverage.

Figure 12A:
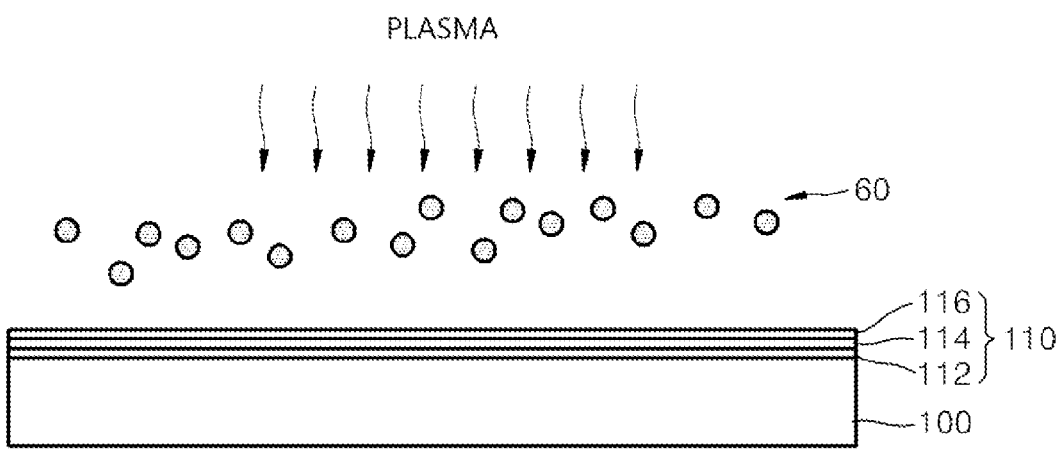
FIG. 12A is a sectional view illustrating the step of forming an insulating film including silicon from the silicon thin film according to an embodiment of the present invention.

FIG. 12A is a sectional view illustrating a step of forming an insulating film including silicon from the silicon thin film according to an embodiment of the present invention. Referring to FIG. 12A, plasma is applied onto the substrate 100 where the silicon thin film 110 is formed. That is, a plasma atmosphere is formed inside the chamber 10 into which the substrate 100 is loaded. To form the plasma atmosphere, Inductively Coupled Plasma (ICP), Capacitively Coupled Plasma (CCP) or Microwave (MW) Plasma may be used. In this time, a power of about 100 W to about 3 kW may be applied to form the plasma atmosphere.

To form the plasma atmosphere, for example, one or more ignition gases selected from a group consisting of Ar, He, Kr, and Xe and, for example, one or more reaction gases 60 selected from a group consisting of O2, O3, N2, and NH3 may be injected. In this case, the ignition gas may be injected at a flow rate of about 100 sccm to about 3000 sccm.

Alternatively, to form the plasma atmosphere, one or more reaction gases 60 selected from the group consisting of O2, O3, N2, and NH3 may be injected. In this case, the reaction gases serve as the ignition gases and thus separate ignition gases may not be injected.

For example, when a gas including an oxygen atom such as O2 or O3 is used as the reaction gas 60, the silicon thin film 110 may react with the oxygen atom included in the reaction gas 60, thereby forming a silicon oxide film. Alternatively, when a gas including a nitrogen atom such as N2 or NH3 is used as the reaction gas 60, the silicon thin film 110 may react with the nitrogen atom included in the reaction gas 60, thereby forming a silicon nitride film.

To change the silicon thin film 110 into the below-described insulating film including silicon such as the silicon oxide film or silicon nitride film at the plasma atmosphere, a pressure inside the chamber 10 into which the substrate 100 is loaded may be maintained about 0.05 Torr to about 10 Torr.

Figure 12B:
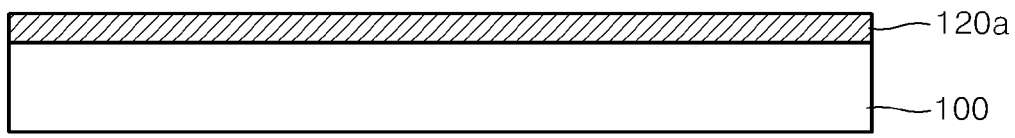
FIG. 12B is a sectional view illustrating a step of performing a second purge step according to an embodiment of the present invention.

FIG. 12B is a sectional view illustrating a second purge step including silicon according to an embodiment of the present invention. Referring to FIGS. 12A and 12B together, the insulating film including silicon 120a may be formed by performing the second purge step, which removes the remaining reaction gas and the reacted byproducts. The insulating film including silicon 120a may be, for example, a silicon oxide film or a silicon nitride film.

If the insulating film including silicon 120a such as a silicon oxide film or a silicon nitride film is formed at the plasma atmosphere, excellent film properties can be obtained. Particularly, even when the insulating film including silicon 120a is formed to have a thin thickness, the insulating film including silicon 120a can have excellent film properties.

In addition, as the above-mentioned, since the silicon thin film 110 has excellent film properties and step coverage, the insulating film including silicon 120a may have also excellent film properties and step coverage. Particularly, since the insulating film including silicon 120a is formed at the plasma atmosphere, the insulating film including silicon 120a can have more excellent film properties.

A purge step, which removes the remaining reaction gas 60 in a non-reacted state or the reacted byproducts from the chamber 10 may be called as a second purge step.

Figure 13:
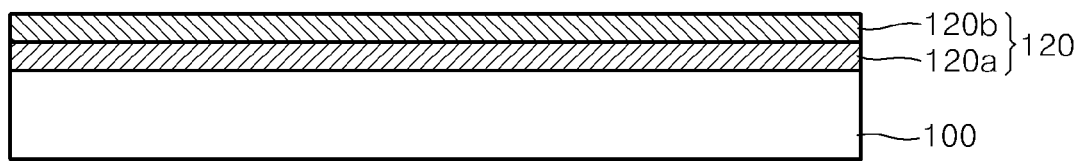
FIG. 13 is a sectional view illustrating an insulating film including silicon according to another embodiment of the present invention.

FIG. 13 is a sectional view illustrating an insulating film including silicon according to another embodiment of the present invention. Referring to FIG. 13, the insulating film 120 including a plurality of the insulating films including silicon 120a and 120b may be formed by repeating the steps described above with reference to FIGS. 10A to 12B.

If the insulating film including silicon 120a is formed from the silicon thin film 110 shown in FIG. 12A, the silicon thin film 110 is changed to the insulating film from an exposed surface. Thus, if the silicon thin film 110 is thick, the oxide or nitrogen for reacting with the silicon thin film must be diffused through the insulating film formed on the surface of the silicon thin film. Consequently, a speed of forming the insulating film becomes slowed as the thickness of the silicon thin film 110 becomes thick.

If the insulating film 120 is relatively thick, the processing time can be reduced by repeating the step of forming the insulating film including silicon after forming a relatively thin silicon thin film, as compared with forming the insulating film from a relatively thick silicon thin film at a time.

Therefore, the number of times that the steps of FIGS. 10A to 12B are repeated may be determined in consideration of the processing time and a desired thickness of the insulating film including silicon.

Moreover, although the insulating film 120 is illustrated as including the two insulating films including silicon 120a and 120b, the insulating film 120 may include three or more insulating films including silicon.

Figure 14:
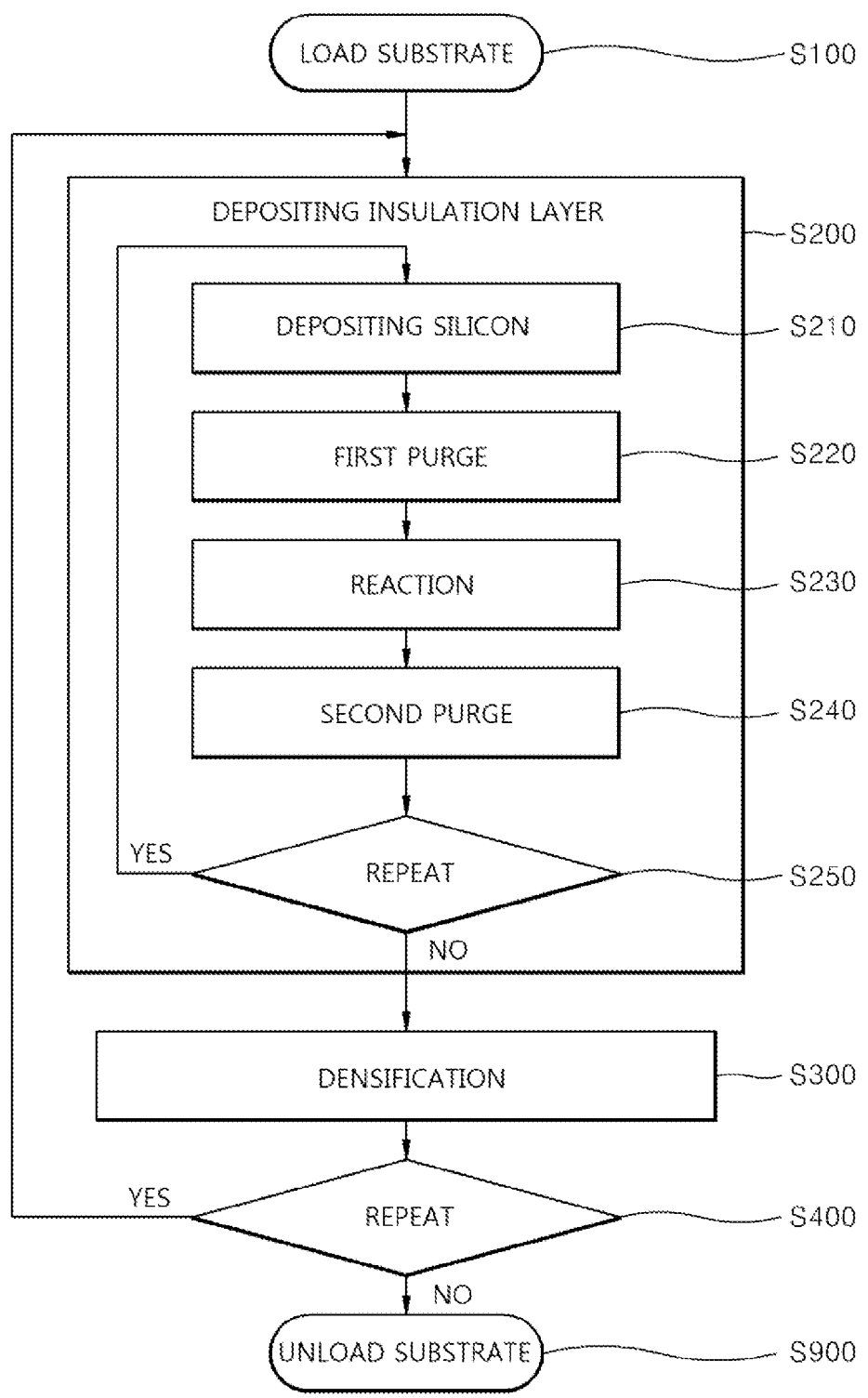
FIG. 14 is a flowchart illustrating a method of depositing a cyclic thin film, according to another embodiment of the present invention.

FIG. 14 is a flowchart illustrating a method of depositing a cyclic thin film according to another embodiment of the present invention.

Referring to FIG. 14, a substrate is loaded into a chamber of a semiconductor manufacturing apparatus S100. An insulating film is deposited on the substrate loaded into the chamber S200, and in the step S200, a silicon deposition step S210, a first purge step S220, a reaction step S230 and a second purge step S240 are performed together to deposit the insulating film.

In the step S210, silicon is deposited on the substrate by injecting a silicon (Si) precursor into the chamber for depositing silicon. After silicon is deposited on the substrate, the first purge step of removing a non-reacted silicon precursor and a reaction byproduct is performed in the step S220.

Subsequently, the reaction step for forming an insulating film including silicon by reacting silicon formed on the substrate with a reaction gas is performed in the step S230. For example, the insulating film including silicon may be a silicon oxide film or a silicon nitride film.

To form silicon as the insulating film including silicon, a first reaction gas may be injected into the chamber. The first reaction gas, for example, may be one or more gases selected from the group consisting of O2, O3, N2, and NH3.

When the insulating film including silicon is the silicon oxide film, the first reaction gas may be a gas including an oxygen atom such as O2 or O3. Alternatively, the first reaction gas may be O* (oxygen radical) or O2− (oxygen anion) that is formed of plasma at an O2 atmosphere. When the insulating film including silicon is the silicon nitride film, the first reaction gas may be a gas including a nitrogen atom such as N2 or NH3.

Subsequently, the second purge step for removing a reacted byproduct and a reaction gas or an ignition gas from the chamber is performed in the step S240.

The silicon deposition step S210, the first purge step S220, the reaction step S230 and the second purge step S240 may be repeatedly performed. The silicon deposition step S210, the first purge step S220, the reaction step S230 and the second purge step S240, for example, may be repeated three to ten times.

A temperature of the substrate and a pressure inside the chamber may be constantly maintained in the step S200 of depositing the insulating film including the silicon deposition step S210, the first purge step S220, the reaction step S230 and the second purge step S240.

In each silicon deposition step S210, at least one silicon atomic layer may be formed on the substrate. The insulating film including silicon may be formed to have a thickness of several or tens of Å. After forming the insulating film including silicon, a step of densifying the insulting film including silicon is performed in a step S300.

To densify the insulating film including silicon, a plasma atmosphere may be formed inside the chamber. Also, together with the plasma atmosphere, a second reaction gas may be additionally injected into the chamber. The second reaction gas, for example, may be one or more gases selected from the group consisting of O2, O3, N2, and NH3.

To obtain an insulating film including silicon and having a desired thickness, the step S200 of depositing the insulating film and step S300 of densifying the insulting film may be repeatedly performed as needed in a step S400.

When the insulating film including silicon and having a desired thickness is formed, the substrate may be unloaded from the chamber in a step S900.

Figure 15:
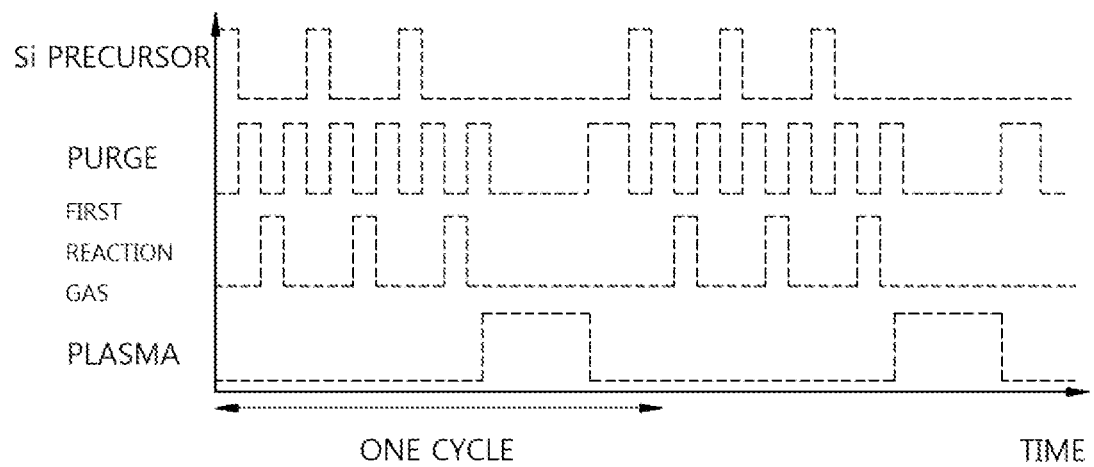
FIG. 15 is a diagram for describing a method of depositing a cyclic thin film, according to another embodiment of the present invention.

FIG. 15 is a diagram describing a method of depositing a cyclic thin film according to another embodiment of the present invention.

Referring to FIG. 15, the injection and purge of a silicon precursor and the injection and purge of the first reaction gas are repeatedly performed. Purge after the injection of the silicon precursor and purge after the injection of the first reaction gas are repeatedly performed, and then a plasma atmosphere is formed. In a state where the plasma atmosphere has been formed, a second reaction gas may be injected as necessary.

As such, from the steps in which the injection and purge of the silicon precursor and the injection and purge of the first reaction gas are repeatedly performed and to the step in which the plasma atmosphere is formed, is performed as one cycle. That is, the insulating film including silicon is formed by repeatedly performing the injection and purge of a silicon precursor and the injection and purge of a reaction gas, and thereafter, the insulating film including silicon is densified by forming a plasma atmosphere.

Moreover, by repeating all the above-described steps, an insulating film including silicon and having a desired thickness can be obtained.

Accordingly, the method of depositing the cyclic thin film can be performed by repeatedly performing the injection and purge of the silicon precursor and the injection and purge of the first reaction gas, and moreover by repeatedly performing the steps of forming and densifying the insulating film including silicon.

The method of depositing the cyclic thin film according to another embodiment of the present invention will be specifically described on a step-by-step with reference to FIG. 16A to 20 based on the above description. In the following description on FIG. 16A to 20, reference numbers of FIG. 14 to 15 may be used as necessary.

Figure 16A:
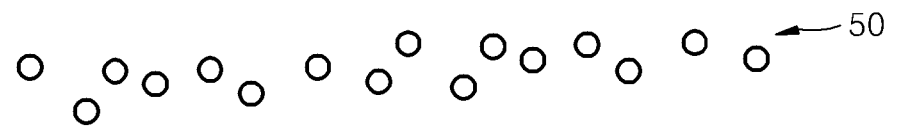
FIG. 16A to 16C are sectional views illustrating a step of depositing silicon, according to another embodiment of the present invention.
Figure 16B:
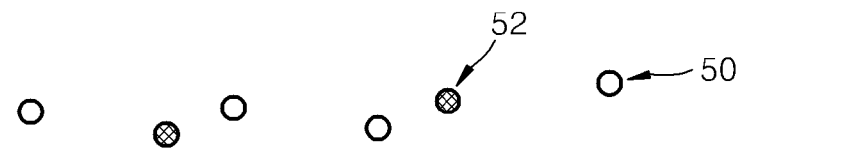
Figure 16C:

FIG. 16A to 16C are sectional views illustrating a step of depositing silicon according to another embodiment of the present invention. FIG. 16A is a sectional view illustrating a step of injecting a silicon precursor according to another embodiment of the present invention.

Referring to FIG. 16A, a silicon precursor 50 is injected into the chamber 10 into which the substrate 100 is loaded.

The substrate 100, for example, may include a semiconductor substrate such as a silicon or compound semiconductor wafer. Alternatively, the substrate 100 may include a substrate material, which differs from a semiconductor, such as glass, metal, ceramic and quartz.

The silicon precursor 50, for example, may be amino-based silane such as bisethylmethylaminosilane (BEMAS), bisdimethylaminosilane (BDMAS), BEDAS, tetrakisethylmethylaminosilane (TEMAS), tetrakisidimethylaminosilane (TDMAS), and TEDAS, or chloride-based silane such as hexachlorinedisilane (HCD).

The substrate 100 may be maintained at a temperature of about 50° C. to about 600° C. for reacting with the silicon precursor 50. Also, a pressure inside the chamber 10 into which the substrate 100 is loaded may be maintained about 0.05 Torr to about 10 Torr.

FIG. 16B is a sectional view illustrating a step of depositing silicon on the substrate according to another embodiment of the present invention. Referring to FIG. 16B, by a portion of the silicon precursors 50 reacting with the substrate 100, a silicon atom may be deposited on the substrate 100 and thus a silicon layer 112 may be formed. The silicon layer 112 may be formed of at least one silicon atomic layer.

A portion of the silicon precursors 50 may react with the substrate 100, thereby forming one or more reacted byproducts 52. Also, the other of the silicon precursors 50 may be remained in a non-reacted state without reacting with the substrate 100.

FIG. 16C is a sectional view illustrating a step of performing a first purge step according to another embodiment of the present invention. Referring to FIG. 16C, the silicon layer 112 is formed on the substrate 100 and then a purge step, which removes the remaining silicon precursors 50 in a non-reacted state and the reacted byproducts 52 from the chamber 10, may be performed. The purge step, which removes the remaining silicon precursors 50 and the reacted byproducts 52 from the chamber 10, may be called as a first purge step.

In the first purge step, the substrate 100 may be maintained at a temperature of about 50° C. to about 600° C. Also, a pressure inside the chamber 10 into which the substrate 100 is loaded may be maintained about 0.05 Torr to about 10 Torr. That is, a temperature of the substrate 100 and a pressure inside the chamber 10 may be constantly maintained in the step of depositing the silicon layer 112 and the first purge step.

Figure 17A:
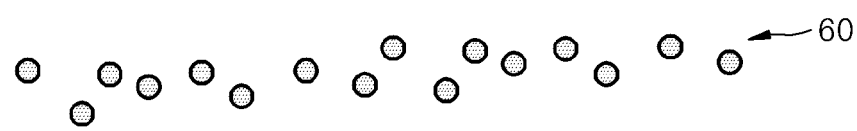
FIG. 17A to 17C are sectional views illustrating a step of forming an insulating film including silicon, according to another embodiment of the present invention.
Figure 17A:
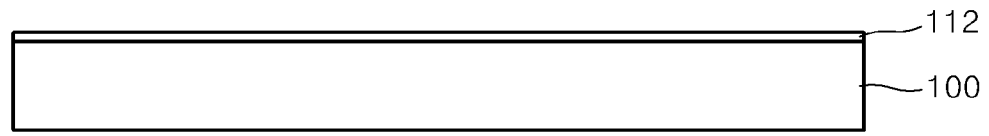
Figure 17B:
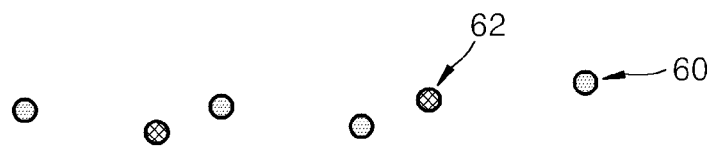
Figure 17B:
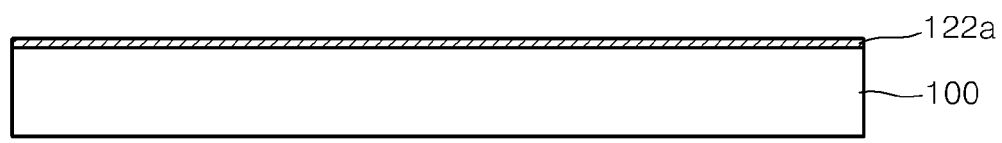
Figure 17C:
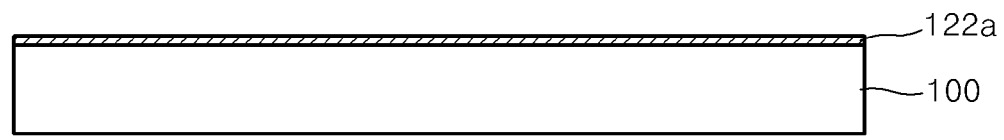

FIG. 17A to 17C are sectional views illustrating a step of forming an insulating film including silicon according to another embodiment of the present invention. FIG. 17A is a sectional view illustrating a step of injecting a reaction gas according to another embodiment of the present invention.

Referring to FIG. 17A, a first reaction gas 60 is injected into the chamber 10 into which the substrate 100 is loaded. The first reaction gas 60, for example, may be one or more gases selected from the group consisting of O2, O3, N2, and NH3. Alternatively, the first reaction gas 60, for example, may be O* (oxygen radical) or O2− (oxygen anion) that is formed by using plasma at an O2 atmosphere.

The substrate 100 may be maintained at a temperature of about 50° C. to about 600° C. for reacting with the first reaction gas 60. Also, a pressure inside the chamber 10 into which the substrate 100 is loaded may be maintained about 0.05 Torr to about 10 Torr.

FIG. 17B is a sectional view illustrating a step of depositing an insulating film including silicon on a substrate according to another embodiment of the present invention. Referring to FIG. 17B, by a portion of the first reaction gas 60 reacting with the silicon layer 112, the insulating film 122a including silicon may be formed on the substrate 100.

The first reaction gas 60 may react with the silicon layer 112, thereby forming a reacted byproduct 62. Also, the other portion of the first reaction gas 60 may be remained in a non-reacted state without reacting with the silicon layer 112.

For example, when a gas including an oxygen atom such as O2 or O3 is used as the first reaction gas 60, or O* (oxygen radical) or O2− (oxygen anion) that is formed of plasma at an O2 atmosphere is used as the first reaction gas 60, the silicon layer 112 may react with the oxygen atom included in the first reaction gas 60 and thus be formed as a silicon oxide layer. Alternatively, when a gas including a nitrogen atom such as N2 or NH3 is used as the first reaction gas 60, the silicon layer 112 may react with the nitrogen atom included in the first reaction gas 60 and thus be formed as a silicon nitride layer.

FIG. 17C is a sectional view illustrating a step of performing the second purge step according to another embodiment of the present invention. Referring to FIG. 17C, the insulating film 112a including silicon is formed on the substrate 100, and then a purge step, which removes the remaining first reaction gas 60 in a non-reacted state and the reacted byproducts 62 from the chamber 10, may be performed. The purge step, which removes the remaining first reaction gas 60 and the reacted byproducts 62 from the chamber 10, may be called as the second purge step.

In the second purge step, the substrate 100 may be maintained at a temperature of about 50° C. to about 600° C. Also, a pressure inside the chamber 10 into which the substrate 100 is loaded may be maintained about 0.05 Torr to about 10 Torr.

Figure 18:
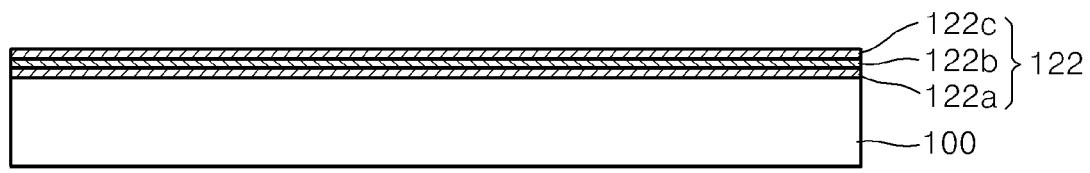
FIG. 18 is a sectional view illustrating an insulating film formed of a plurality of silicon, according to another embodiment of the present invention.

FIG. 18 is a sectional view illustrating forming a plurality of insulating films including silicon according to another embodiment of the present invention. Referring to FIG. 18, by repeating the steps of FIG. 16A to 17C, an insulating film 122 including a plurality of insulating films 122a to 122c including silicon is formed.

The insulating film 122 may have a thickness of several or tens of Å. A step of depositing each insulating film 122a, 122b or 122c including silicon may be repeatedly performed three to ten times such that the insulating film 122 includes three to ten insulating films 122a to 122c including silicon.

In this way, when the insulating film 122 is formed to include the plurality of insulating films 122a to 122c including silicon, the insulating film 122 can have excellent film properties and step coverage.

Figure 19A:
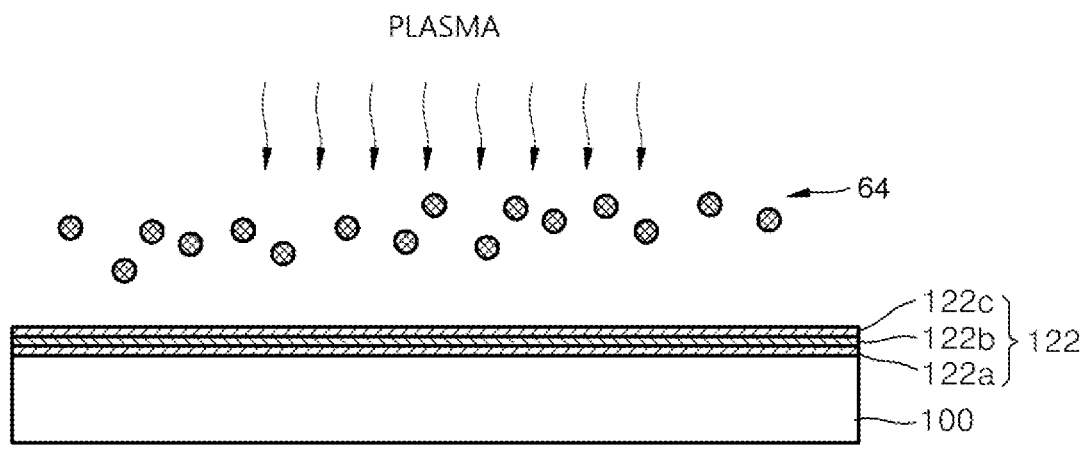
FIG. 19A to 19B are sectional views illustrating a step of densifying an insulating film, according to another embodiment of the present invention.
Figure 19B:
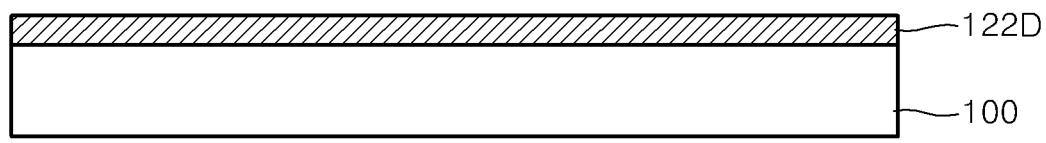

FIGS. 19A and 19B are sectional views illustrating a step of densifying the insulating film according to another embodiment of the present invention. FIG. 19A is a sectional view illustrating a step of supplying a plasma atmosphere to the insulating film, according to another embodiment of the present invention.

Referring to FIG. 19A, plasma is applied onto the substrate 100 where the insulating film 122 is formed. That is, a plasma atmosphere is formed inside the chamber 10 into which the substrate 100 is loaded. To form the plasma atmosphere, Inductively Coupled Plasma (ICP), Capacitively Coupled Plasma (CCP) or Microwave (MW) Plasma may be used. In this time, a power of about 100 W to about 3 kW may be applied for forming the plasma atmosphere.

To form the plasma atmosphere, one or more ignition gases selected from the group consisting of Ar, He, Kr, and Xe may be injected. In this case, the ignition gas may be injected at a flow rate of about 100 sccm to about 3000 sccm.

A second reaction gas 64 may be additionally injected for more densifying the insulating film 122 at the plasma atmosphere. The second reaction gas 64, for example, may be one or more gases selected from the group consisting of O2, O3, N2, and NH3, or be O* (oxygen radical) or O2− (oxygen anion) that is formed of plasma at an O2 atmosphere.

For example, when the insulating film 122 is the silicon oxide film, a gas including an oxygen atom such as O2 or O3 may be used as the second reaction gas 64, O* (oxygen radical) or O2− (oxygen anion) that is formed of plasma at the O2 atmosphere may be used as the second reaction gas 64, or H2 may be used as the second reaction gas 64.

For example, when the insulating film 122 is the silicon nitride film, a gas including a nitrogen atom such as N2 or NH3 may be used as the second reaction gas 64, or H2 may be used as the second reaction gas 64.

FIG. 19B is a sectional view illustrating the step of forming a densified insulating film 122D according to another embodiment of the present invention. Referring to FIGS. 19A and 19B, the insulating film 122 may be densified at the plasma atmosphere and thus the densified insulating film 122D may be formed. To form the densified insulating film 122D, a pressure inside the chamber 10 into which the substrate 100 is loaded may be maintained about 0.05 Torr to about 10 Torr.

Also, the densified insulating film 122D that is obtained by processing the insulating film 122 at the plasma atmosphere can have good film properties in insulating characteristic. Particularly, even when the densified insulating film 122D is formed to have a thin thickness, the densified insulating film 122D can have good film properties.

Figure 20:
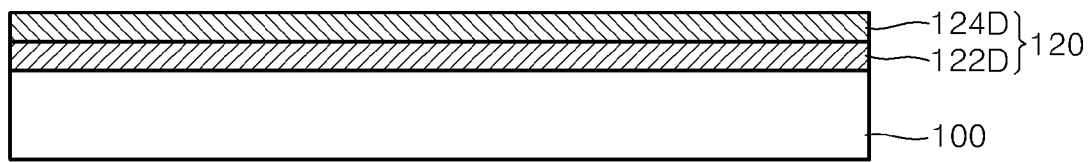
FIG. 20 is a sectional view illustrating an insulating film formed of silicon, according to another embodiment of the present invention.

FIG. 20 is a sectional view illustrating an insulating film including silicon according to another embodiment of the present invention. Referring to FIG. 20, the insulating film 120 including a plurality of the densified insulating films 122D and 124D may be formed by repeating the steps described above with reference to FIGS. 16A to 19B.

If the insulating film 122 shown in FIG. 19A is relatively thick, the influence of plasma or the second reaction gas 64 on a lower portion of the insulating film 122 is relatively less. Therefore, in order to further enhance the film properties of the insulating film 120, the insulating film 120 including the densified insulating films 122D and 124D may be formed to have a relatively thinner thickness.

Moreover, although the insulating film 120 is illustrated as including the two densified insulating films 122D and 124D, the insulating film 120 may include three or more densified insulating films. That is, the number of densified insulating films included in the insulating film 120 may be determined in consideration of the desired thickness of the insulating film 120. In other words, the number of times the steps of FIGS. 16A to 19B are repeated may be determined in consideration of the desired thickness of the insulating film 120.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing apparatus comprising:
   a chamber where processes with respect to a substrate are carried out;
   a substrate support on which the substrate is placed, the substrate support being disposed within the chamber;
   an antenna disposed in an upper portion of the chamber to form an electric field within the chamber; and
   a showerhead in which an inlet for supplying reaction gas into the chamber and an outlet for discharging the reaction gas supplied into the chamber are disposed in symmetry to each other,
   wherein the antenna comprises a first antenna and a second antenna, which are disposed in rotational symmetry with respect to a preset center,
   the first antenna comprises a first inner antenna and a first intermediate antenna which respectively have semi-circular shapes and first and second radii and are respectively disposed on one side and the other side with respect to the preset center line and a first connection antenna connecting the first inner antenna to the first intermediate antenna, and
   the second antenna comprises a second intermediate antenna and a second inner antenna which respectively have semi-circular shapes and have first and second radii and are respectively disposed on one side and the other side with respect to the center line and a second connection antenna connecting the second intermediate antenna to the second inner antenna, and
   the showerhead includes
      a plurality of diffusion passages vertically stacked apart from each other and connected to the inlet in order that the reaction gas flows along an inner space of the diffusion passages, each of the diffusion passages having a sectional area gradually increasing along a flow direction of the reaction gas thereby diffusing the reaction gas, and
      inflow connection passages connecting the diffusion passages such that all the diffusion passages are connected in series as a whole, whereby the supplied reaction gas flows into the chamber through all of the diffusion passages and the inflow connection passages.

2. The substrate processing apparatus of claim 1, wherein the first antenna further comprises a semicircular-type first outer antenna having a third radius and disposed on one side of the center line,
   the second antenna further comprises a semicircular-type second outer antenna having the third radius and disposed on the other side of the center line,
   the first intermediate antenna is disposed between the second inner antenna and the second outer antenna, and
   the second intermediate antenna is disposed between the first inner antenna and the first outer antenna.

3. The substrate processing apparatus of claim 1, wherein the antenna has a flat shape on which the first and second antennae are flush with each other.

4. The substrate processing apparatus of claim 1, wherein the chamber comprises a lower chamber having an opened upper side, a chamber cover disposed under the antenna to open and close the upper side of the lower chamber, and an adjustment plate disposed between the antenna and the chamber cover to adjust the electric field formed within the chamber.

5. The substrate processing apparatus of claim 4, wherein a thickness of the adjustment plate is determined by a process rate within the chamber.

6. The substrate processing apparatus of claim 1, wherein the diffusion passages are vertically disposed.

7. The substrate processing apparatus of claim 1, wherein the showerhead comprises a plurality of convergent passages connected to the outlet and having a sectional area gradually decreasing along a flow direction of the reaction gas and outflow connection passages connecting the convergent passages in series to each other.

* * * * *